(12) United States Patent
Cassagnes et al.

(10) Patent No.: US 12,418,302 B2
(45) Date of Patent: Sep. 16, 2025

(54) SIGMA-DELTA ANALOGUE TO DIGITAL CONVERTER

(71) Applicant: NXP USA, INC., Austin, TX (US)

(72) Inventors: Thierry Dominique Yves Cassagnes, Tournefeuille (FR); Francesco d'Esposito, Toulouse (FR); Pascal Sandrez, Toulouse (FR); Olivier Tico, St Lys (FR); Simon Brule, Toulouse (FR)

(73) Assignee: NXP USA, Inc., Austin, TX (US)

( * ) Notice: Subject to any disclaimer, the term of this patent is extended or adjusted under 35 U.S.C. 154(b) by 221 days.

(21) Appl. No.: 18/455,291

(22) Filed: Aug. 24, 2023

(65) Prior Publication Data
US 2024/0080035 A1 Mar. 7, 2024

(30) Foreign Application Priority Data
Sep. 2, 2022 (EP) .................... 22306305

(51) Int. Cl.
*H03M 1/12* (2006.01)
*H03M 1/18* (2006.01)
*H03M 3/00* (2006.01)

(52) U.S. Cl.
CPC .......... *H03M 1/123* (2013.01); *H03M 1/183* (2013.01); *H03M 3/458* (2013.01)

(58) Field of Classification Search
CPC ...... H03M 1/123; H03M 1/183; H03M 3/458; H03M 3/39; H03M 1/122; H03M 3/464
(Continued)

(56) References Cited
U.S. PATENT DOCUMENTS 9,553,462 B2  1/2017  Song et al.
10,826,523 B2 * 11/2020  Adusumalli ......... G01R 31/382
(Continued)

*Primary Examiner* — Jean B Jeanglaude

(57) ABSTRACT

A sigma-delta ADC comprising: a first-input-resistor connected in series between a first-input-terminal and a first-feedback-node; a second-input-resistor connected in series between a second-input-terminal and a second-feedback-node; a third-input-resistor connected in series between a third-input-terminal and a third-feedback-node; a first-multiplexer-switch connected in series between the first-feedback-node and a first-amplifier-second-input-terminal; a second-multiplexer-switch connected in series between the second-feedback-node and a first-amplifier-first-input-terminal; a third-multiplexer-switch connected in series between the third-feedback-node and the first-amplifier-second-input-terminal; a first-feedback-current-source having a first terminal and second terminal, wherein the second terminal is connected to a reference-terminal; a second-feedback-current-source having a first terminal and second terminal, wherein the second terminal is connected to the reference-terminal; a first-feedback-selection-switch connected in series between the first-feedback-node and the first terminal of the first-feedback-current-source; a second-feedback-selection-switch connected in series between the second-feedback-node and the first terminal of the second-feedback-current-source; and a third-feedback-selection-switch connected in series between the third-feedback-node and the first terminal of the first-feedback-current-source.

17 Claims, 7 Drawing Sheets

(58) Field of Classification Search
USPC .......................................................... 341/155
See application file for complete search history.

(56) References Cited

U.S. PATENT DOCUMENTS

| | | |
|---|---|---|
| 2004/0066803 A1 | 4/2004 | Talwalkar et al. |
| 2012/0056661 A1 | 3/2012 | Shabra |
| 2012/0286792 A1 | 11/2012 | Gorbold et al. |
| 2013/0214951 A1* | 8/2013 | Ho .................. H03M 3/458 |
| | | 341/143 |
| 2014/0354308 A1* | 12/2014 | Hong .................. G01K 7/22 |
| | | 324/123 C |
| 2017/0201270 A1 | 7/2017 | Nittala et al. |
| 2021/0399738 A1 | 12/2021 | Brule et al. |
| 2022/0302890 A1* | 9/2022 | Ippolito .............. H03F 3/45475 |

* cited by examiner

Thick lines: high-voltage nets
Thin lines: low-voltage nets

SIGMA-DELTA ANALOGUE TO DIGITAL CONVERTER

CROSS-REFERENCE TO RELATED APPLICATIONS

This application claims the priority under 35 U.S.C. § 119 of European Patent application no. 22306305.8, filed on 2 Sep. 2022, the contents of which are incorporated by reference herein.

FIELD

The present disclosure relates to sigma-delta analogue to digital converters (ADCs), and battery management systems (BMSs) that use such ADCs.

SUMMARY

According to a first aspect of the present disclosure there is provided a sigma-delta ADC comprising:
- a first-input-terminal configured to receive a first-analogue-input-signal;
- a second-input-terminal configured to receive a second-analogue-input-signal;
- a third-input-terminal configured to receive a third-analogue-input-signal;
- a reference-terminal;
- a first-amplifier-stage comprising:
  - a first-amplifier-first-input-terminal;
  - a first-amplifier-second-input-terminal;
- a first-input-resistor connected in series between the first-input-terminal and a first-feedback-node;
- a second-input-resistor connected in series between the second-input-terminal and a second-feedback-node;
- a third-input-resistor connected in series between the third-input-terminal and a third-feedback-node;
- a first-multiplexer-switch connected in series between the first-feedback-node and the first-amplifier-second-input-terminal;
- a second-multiplexer-switch connected in series between the second-feedback-node and the first-amplifier-first-input-terminal;
- a third-multiplexer-switch connected in series between the third-feedback-node and the first-amplifier-second-input-terminal;
- a first-feedback-current-source having a first terminal and second terminal, wherein the second terminal is connected to the reference-terminal;
- a second-feedback-current-source having a first terminal and second terminal, wherein the second terminal is connected to the reference-terminal;
- a first-feedback-selection-switch connected in series between the first-feedback-node and the first terminal of the first-feedback-current-source;
- a second-feedback-selection-switch connected in series between the second-feedback-node and the first terminal of the second-feedback-current-source; and
- a third-feedback-selection-switch connected in series between the third-feedback-node and the first terminal of the first-feedback-current-source.

Advantageously, such a sigma-delta ADC can provide good electromagnetic compatibility (EMC) robustness and can enable the multiplexer-switches to not reduce the accuracy of the conversion equation that is provided by the ADC.

The sigma-delta ADC may further include one or more:
- even-input-terminals each configured to receive a respective even-analogue-input-signal;
- even-input-resistors, each connected in series between a respective one of the even-input-terminals and a respective even-feedback-node;
- even-multiplexer-switches, each connected in series between a respective one of the even-feedback-nodes and the first-amplifier-second-input-terminal; and
- even-feedback-selection-switches, each connected in series between a respective one of the even-feedback-nodes and the first terminal of the first-feedback-current-source.

The sigma-delta ADC may further include one or more:
- odd-input-terminals each configured to receive a respective odd-analogue-input-signal;
- odd-input-resistors, each connected in series between a respective one of the odd-input-terminals and a respective odd-feedback-node;
- odd-multiplexer-switches, each connected in series between a respective one of the odd-feedback-nodes and the first-amplifier-first-input-terminal; and
- odd-feedback-selection-switches, each connected in series between a respective one of the odd-feedback-nodes and the first terminal of the second-feedback-current-source.

The first-multiplexer-switch may be connected in series between the first-feedback-node and an even-amplifier-connection-node. The second-multiplexer-switch may be connected in series between the second-feedback-node and an odd-amplifier-connection-node. A third-multiplexer-switch may be connected in series between the third-feedback-node and the even-amplifier-connection-node.

The sigma-delta ADC may further comprise:
- a first-even-amplifier-connection-switch connected in series between the even-amplifier-connection-node and the first-amplifier-second-input-terminal;
- a second-even-amplifier-connection-switch connected in series between the even-amplifier-connection-node and the first-amplifier-first-input-terminal;
- a first-odd-amplifier-connection-switch connected in series between the odd-amplifier-connection-node and the first-amplifier-first-input-terminal; and
- a second-odd-amplifier-connection-switch connected in series between the odd-amplifier-connection-node and the first-amplifier-second-input-terminal.

The first-feedback-selection-switch may be connected in series between the first-feedback-node and an even-current-source-connection-node. The second-feedback-selection-switch may be connected in series between the second-feedback-node and an odd-current-source-connection-node. A third-feedback-selection-switch may be connected in series between the third-feedback-node and the even-current-source-connection-node.

The sigma-delta ADC may further comprise:
- a first-even-current-source-connection-switch connected in series between the even-current-source-connection-node and the first-feedback-current-source;
- a second-even-current-source-connection-switch connected in series between the even-current-source-connection-node and the second-feedback-current-source;
- a first-odd-current-source-connection-switch connected in series between the odd-current-source-connection-node and the second-feedback-current-source; and
- a second-odd-current-source-connection-switch connected in series between the odd-current-source-connection-node and the first-feedback-current-source.

Each of the even-multiplexer-switches may be connected in series between the respective one of the even-feedback-nodes and the even-amplifier-connection-node. Each of the odd-multiplexer-switches may be connected in series between the respective one of the odd-feedback-nodes and the odd-amplifier-connection-node. Each of the even-feedback-selection-switches may be connected in series between the respective one of the even-feedback-nodes and the even-current-source-connection-node. Each of the odd-feedback-selection-switches may be connected in series between the respective one of the odd-feedback-nodes and the odd-current-source-connection-node.

The sigma-delta ADC may further comprise:
- a first-feedback-switch connected in series between: i) the first-feedback-current-source; and ii) each of the first-even-current-source-connection-switch and the second-odd-current-source-connection-switch, such that the first-feedback-switch can selectively disconnect the first-feedback-current-source from the even-current-source-connection-node and the odd-current-source-connection-node; and
- a second-feedback-switch connected in series between: i) the second-feedback-current-source; and ii) each of the second-even-current-source-connection-switch and the first-odd-current-source-connection-switch, such that the second-feedback-switch can selectively disconnect the second-feedback-current-source from the even-current-source-connection-node and the odd-current-source-connection-node.

The reference-terminal may be connected to a negative reference voltage.

The sigma-delta ADC may be a continuous time sigma-delta ADC.

There may be provided a battery management system for a vehicle, wherein the battery management system comprises any sigma-delta ADC disclosed herein.

There may be provided a vehicle comprising any battery management system disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

The Battery Management Systems (BMS) integrated circuits (ICs), in electrical cars, require the measurement of individual cells located in a stack of rechargeable battery cells. A challenge of this type of configuration is the high common mode voltage of the different cells, which can typically go up to a hundred volts.

Figure 1:
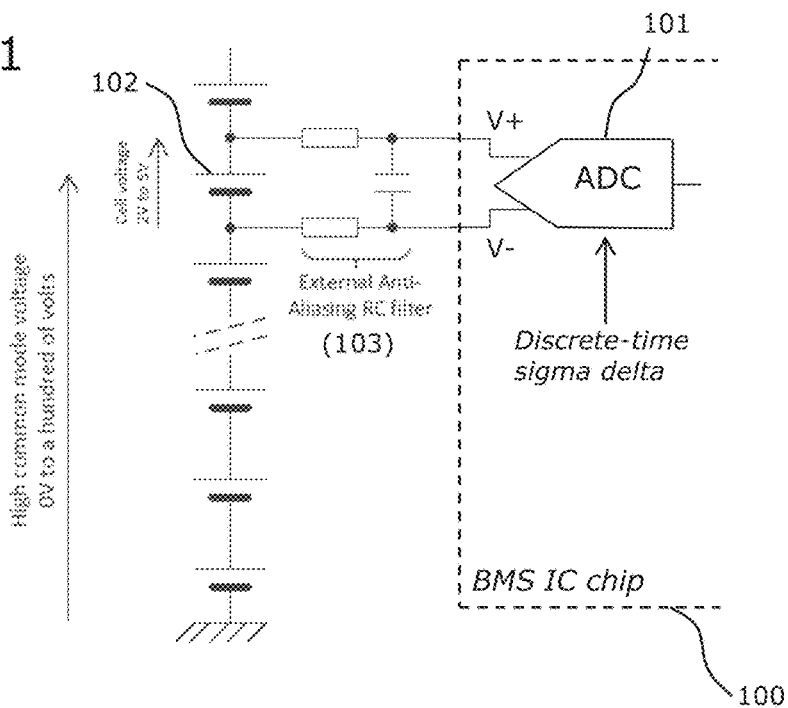
FIG. 1 shows a discrete-time sigma-delta ADC on a BMS IC.

FIG. 1 shows a discrete-time sigma-delta ADC 101 on a BMS IC 100. The BMS IC 100 is shown connected across a single cell 102 in a stack of cells. The voltage across the single cell 102 may be in the region of 2V to 5V. The common mode voltage across the entire stack may be considered as a high voltage, and may be up to about 100V in some examples. The sigma-delta ADC 106 has a high-voltage sampling capacitor (not shown) at its inputs.

This discrete time approach, because the input signal is sampled on the sampling capacitors, necessitates the use of external anti-aliasing RC filters 108. Use of the anti-aliasing RC filters 108 increases the board level integration complexity and cost of the circuit, which is clearly undesirable.

If a continuous-time sigma-delta ADC is used in a BMS IC, then no external anti-aliasing RC filters are present. That is, the BMS IC has a plurality of Cell Balancing pins (CB pins) that are connected to battery cell elements for measuring the voltage across the battery cell elements (and therefore providing a plurality of input channels). Examples disclosed herein relate to the use of a Multiplexed Continuous Time Delta-Sigma Converter, in which a single ADC can be selectively connected to different ones of the Cell Balancing pins. That is, a high voltage multiplexer is provided to be able to measure several channels with the same core ADC. This can advantageously reduce die size by avoiding the duplication of ADCs. Furthermore, as will be discussed below, such a Multiplexed Continuous Time Delta-Sigma Converter can provide optimal EMC robustness and can be immune to the series resistance of the switches that provide the functionality of the multiplexer. Yet further, some of the examples described herein can take advantage of the Multiplexed Continuous Time Delta-Sigma Converter topology by incorporating chopping switches that enable offset and 1/f noise (for example from a first integrator high voltage operational amplifier) to be reduced. The Multiplexed Continuous Time Delta-Sigma Converter of the present disclosure can therefore enable good accuracy performance of the resulting high-voltage converter. Further details will be provided below.

Figure 2:
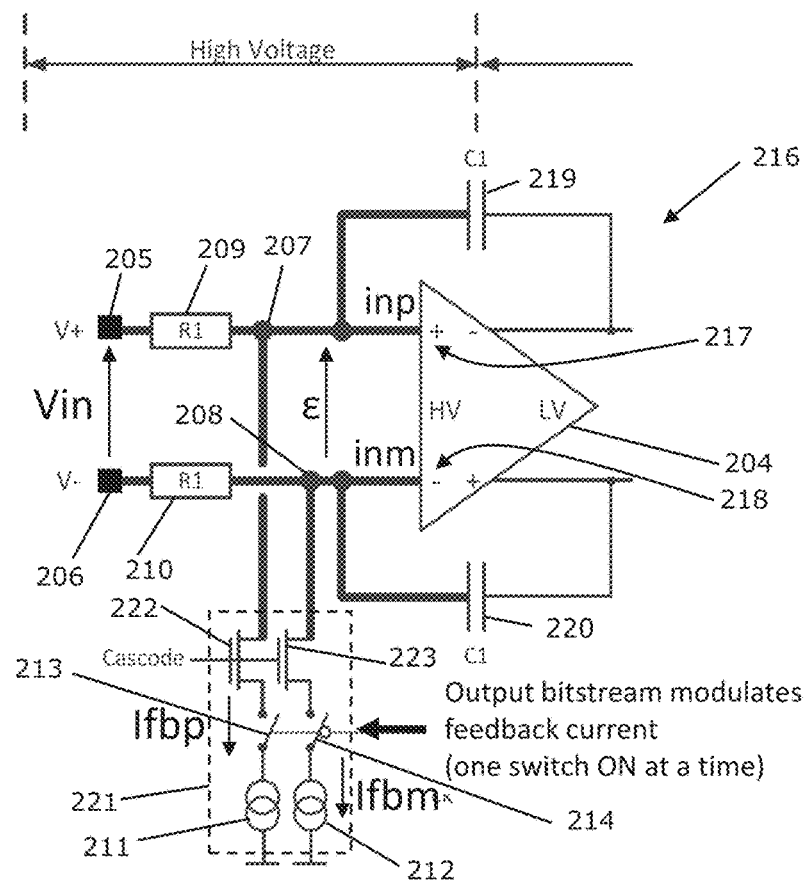
FIG. 2 illustrates an example of a continuous-time delta-sigma ADC without multiplexing.

FIG. 2 illustrates an example of a continuous-time delta-sigma ADC 216 without multiplexing. That is, the ADC 216 that is shown in FIG. 2 would be repeated for each pair of cell balancing pins.

The ADC 216 includes a first-input-terminal 205 (V+) and a second-input-terminal 206 (V−). The first-input-terminal 205 receives a first-analogue-input-signal, and the secondinput-terminal 206 receives a second-analogue-input-signal. As will be appreciated from FIG. 1, the first-input-terminal 205 (V+) and the second-input-terminal 206 can be connected across a single cell in a stack of cells.

The first-analogue-input-signal and the second-analogue-input-signal can be considered as high voltage signals. A high voltage signal, as it is described herein may be one that is greater than or equal to 10V, 40V, greater than or equal to 80V, greater than or equal to 90V, greater than or equal to 120V, or greater than or equal to 200V. It will be appreciated that the level of the high voltage signal can be determined by the technology that is used. In automotive applications, a voltage level that is greater than or equal to 10V is presently referred to as a high voltage. A high voltage signal may be one that is at a level that pure CMOS structures would not be able to handle because the voltage applied on the gates would exceed the maximum rating of the technology. A high voltage device is one that is capable of handling a high voltage signal. A low voltage signal, as it is described herein, may be one that is less than or equal to 5V, 3V, less than or equal to 1.8V, or less than or equal to 1V. It will be appreciated that the level of the low voltage signal can also be determined by the technology that is used. In automotive applications, a standard CMOS technology that has a voltage of less than or equal to 3V is presently referred to as a low voltage. A low voltage device is one that is suitable for handling a low voltage signal. In FIG. 2, and various other figures, high voltage lines/signals are illustrated with thick lines and low voltage lines/signals are illustrated with thin lines.

The ADC 216 also includes an output-terminal (not shown), which provides an output-digital-signal (Bitstream), which is representative of the difference between first-analogue-input-signal and the second-analogue-input-signal.

Figure 6:
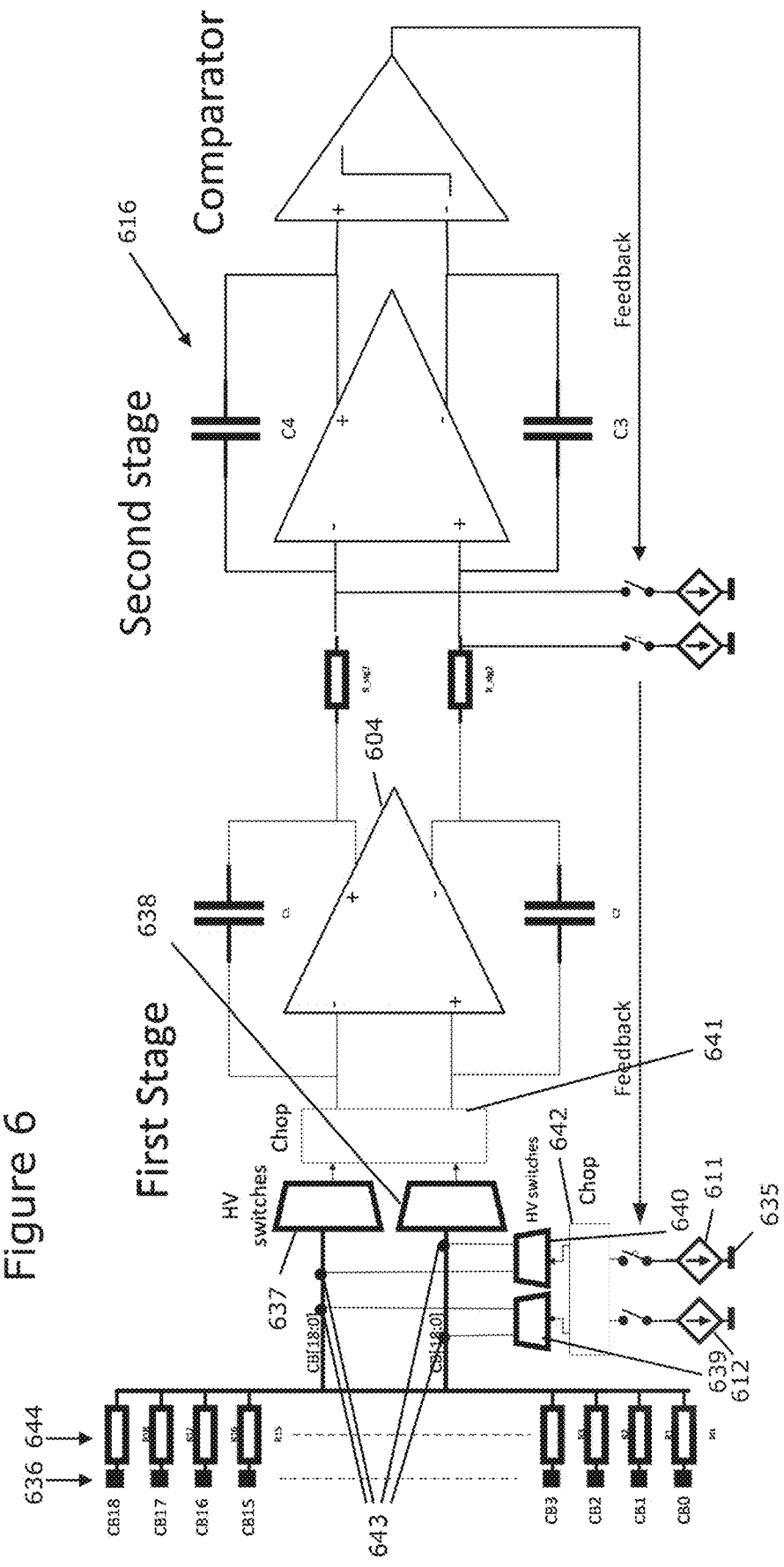
FIG. 6 shows another example embodiment of a high voltage multiplexed continuous time sigma-delta ADC according to an embodiment of the present disclosure.

The ADC 216 includes a first-amplifier-stage 204, which may also be referred to as an integrator. In this example, the ADC 216 is a first-order ADC and therefore has only one amplifier-stage 204. However, it will be appreciated that additional amplifier-stages (integrators) can be used to provide a higher order ADC. For instance, a second order ADC can be used, as shown in FIG. 6.

Returning to FIG. 2, the first-amplifier-stage 204 includes: a first-amplifier-first-input-terminal 217; and a first-amplifier-second-input-terminal 218.

The ADC 216 includes a first-input-resistor 209 connected in series between the first-input-terminal 205 and a first-feedback-node 207. The first-feedback-node 207 is, in turn, connected to the first-amplifier-first-input-terminal 217. The ADC 216 also includes a second-input-resistor 210 connected in series between the second-input-terminal 206 and a second-feedback-node 208. The second-feedback-node 208 is, in turn, connected to the first-amplifier-second-input-terminal 218. These input-resistors 209, 210 can provide good robustness in terms of electrostatic discharge (ESD) and electromagnetic compatibility (EMC).

A first-integration-capacitor 219 is connected between a first-amplifier-first-output-terminal and the first-amplifier-first-input-terminal 217. A second-integration-capacitor 220 is connected between a first-amplifier-second-output-terminal and the first-amplifier-second-input-terminal 218. As is known in the art, these integration-capacitors 219, 220 contribute to the first-amplifier-stage 204 operating as an integrator.

As shown in FIG. 2, the ADC 216 also includes a feedback-current-block 221. The feedback-current-block 221 is used to provide feedback current to the first-amplifier-first-input-terminal 217 and the first-amplifier-second-input-terminal 218.

The feedback-current-block 221 includes a first-feedback-transistor 222, a second-feedback-transistor 223, a first-feedback-switch 213, a second-feedback-switch 214, a first-feedback-current-source 211, and a second-feedback-current-source 212.

The first-feedback-transistor 222 has a conduction channel that is connected in series between: (i) the first-feedback-node 207 (and therefore also the first-input-terminal 205 via the first-input-resistor 209); and (ii) a first terminal of the first-feedback-switch 213. A second terminal of the first-feedback-switch 213 is connected to a first terminal of the first-feedback-current-source 211. A second terminal of the first-feedback-current-source 211 is connected to a reference-terminal (in this example ground). In this way, each of the following components is connected in series between the first-feedback-node 207 (and therefore also the first-input-terminal 205) and the reference-terminal: the conduction channel of the first-feedback-transistor 222; the first-feedback-switch 213; and the first-feedback-current-source 211. More particularly, in this example the first-feedback-switch 213 and the first-feedback-current-source 211 are both connected in series between: (i) a first terminal of the conduction channel of the first-feedback-transistor 222; and (ii) the reference-terminal. A second (the other) terminal of the conduction channel of the first-feedback-transistor 222 is connected to the first-feedback-node 207.

The conduction channel of the first-feedback-transistor 222 is used to convey the current from the first-feedback-current-source 211. The conduction channel can also sustain the high voltage that is present at the first-amplifier-first-input-terminal 217, while enabling the first-feedback-switch 213 and the first-feedback-current-source 211 to operate in the low voltage domain.

The control terminal (in this example the gate) of the first-feedback-transistor 222 is connected to a reference voltage, as is known in the art. The first-feedback-transistor 222 can be provided as an nmos field effect transistor (FET) that is capable of handling high voltages. For instance, the nmos FET may be capable of handling high voltages from its drain to its source (VDS) and/or from its gate to its source (VGS). In other examples the first-feedback-transistor 222 can be provided as bipolar junction transistor (BJT).

In this example, the first-feedback-transistor 222 and the first-feedback-current-source 211 can be considered as a cascode. The cascode includes both a high voltage device (the first-feedback-transistor 222) and a low voltage device (first-feedback-current-source 211). The high voltage device (the first-feedback-transistor 222) is used to protect the low voltage device (first-feedback-current-source 211) under it. Using a cascode can be advantageous because it can enable a low voltage device to be used in combination with a high voltage device. Using the low voltage device can enable good matching to be achieved, and therefore a relatively low (undesired) offset. Using the high voltage device can provide the required functionality of sustaining the high voltage at the first-amplifier-first-input-terminal 217.

There is a similar arrangement of components connected to the first-amplifier-second-input-terminal 218. The second-feedback-transistor 223 has a conduction channel that is connected in series between: (i) the second-feedback-node 208 (and therefore also the second-input-terminal 206 via the second-input-resistor 210); and (ii) a first terminal of the second-feedback-switch 214. A second terminal of the second-feedback-switch 214 is connected to a first terminal of the second-feedback-current-source 212. A second terminal of the second-feedback-current-source 212 is connected to a reference-terminal (in this example ground). In this way, each of the following components is connected in series between the second-feedback-node 208 (and therefore also the second-input-terminal 206) and the reference-terminal: the conduction channel of the second-feedback-transistor 223; the second-feedback-switch 214; and the second-feedback-current-source 212. More particularly, in this example the second-feedback-switch 214 and the second-feedback-current-source 212 are both connected in series between: (i) a first terminal of the conduction channel of the second-feedback-transistor 223; and (ii) the reference-terminal. A second (the other) terminal of the conduction channel of the second-feedback-transistor 223 is connected to the second-feedback-node 208.

The conduction channel of the second-feedback-transistor 223 is used to convey the current from the second-feedback-current-source 212. The conduction channel can also sustain the high voltage that is present at the second-amplifier-first-input-terminal 218, while enabling the second-feedback-switch 214 and the second-feedback-current-source 212 to operate in the low voltage domain. The second-feedback-transistor 223 can be implemented in the same way as the first-feedback-transistor 222, as described above.

That is, the second-feedback-transistor 223 can be provided as an nmos field effect transistor (FET) that is capable of handling high voltages. Also, the second-feedback-transistor 223 and the second-feedback-current-source 212 can be considered as a cascode.

The first-feedback-switch 213 and the second-feedback-switch 214 are both operated in accordance with the state of the output-digital-signal (Bitstream). More particularly, when the output-digital-signal is in a first state (e.g. digital 1), the first-feedback-switch 213 is closed and the second-feedback-switch 214 is open. Similarly, when the output-digital-signal is in a second state (e.g. digital 0), the first-feedback-switch 213 is open and the second-feedback-switch 214 is closed.

As shown schematically in the drawing, one terminal of the conduction channels of each of the first-feedback-transistor 222 and the second-feedback-transistor 223 are connected to high voltage signals (the terminals that are connected to the corresponding first-amplifier-input-terminal 217, 218 of the amplifier stage 204), and the other terminals are connected to low voltage signals (the terminals that are connected to the corresponding feedback-current-sources 211, 212). Therefore, the first-feedback-transistor 222 and the second-feedback-transistor 223 are designed such that they are sufficiently robust such that they can withstand the high input common-mode voltages that can be present at the first-amplifier-input-terminals 217, 218 of the first-amplifier-stage 204.

The feedback current modulation gives a digital representation of the input voltage. The conversion equation (during conversion when c=0) is, on average:

$$V_{in}=R_1 \cdot I_{fbp} - R_1 \cdot I_{fbm} = R_1 \cdot (I_{fbp} - I_{fbm})$$

Where:
 $V_{in}$ is the voltage difference between the first-input-terminal 205 and the second-input-terminal 206;
 $R_1$ is the resistance of the first-input-resistor 209 and the second-input-resistor 210;
 $I_{fbp}$ is the average current provided by the first-feedback-current-source 211, according to the sequence of pulses that closes the first-feedback-switch 213, that passes through the first-input-resistor 209;
 $I_{fbm}$ is the average current provided by the second-feedback-current-source 212, according to the sequence of pulses that closes the second-feedback-switch 214, that passes through the first-input-resistor 209; and
 $(I_{fbp}-I_{fbm})$ represents the average bitstream value which modulates the feedback current (sequence of Ifbp and Ifbm pulses).

Figure 3:
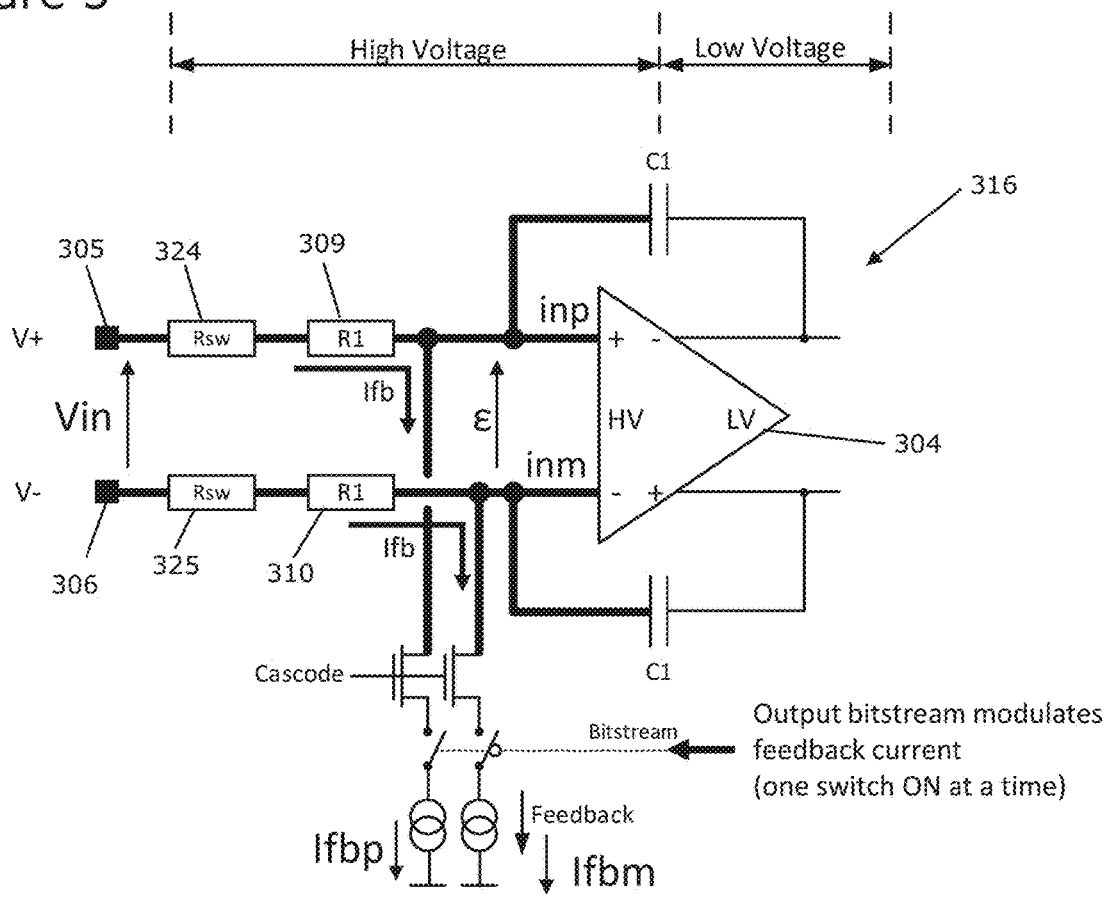
FIG. 3 illustrates an example of a continuous-time delta-sigma ADC that includes a multiplexer.

FIG. 3 illustrates an example of a continuous-time delta-sigma ADC 316 that includes a multiplexer. The functionality of the multiplexer is illustrated by switch-resistances Rsw 324, 325, which represent equivalent resistors of corresponding multiplexer-switches when they are closed.

In FIG. 3, only a first-input-terminal 305 and a second-input-terminal 306 are shown as being selectively connectable (through operation of the multiplexer-switches that are represented by the switch-resistances Rsw 324, 325) to the first-amplifier-stage 304. However, it will be appreciated that the BMS IC that includes the ADC 316 will include additional input-terminals that can be selectively connected to the first-amplifier-stage 304. This is shown in more detail in FIG. 6, for example. In this way, the ADC 316 can be used for a plurality of different pairs of input-terminals such that the ADC 316 is multiplexed between several channels.

In FIG. 3, the multiplexer is placed in front of the ADC 316, as shown by the switch-resistances Rsw 324, 325 being positioned between the input-terminals 305, 306 and the corresponding input-resistors 309, 310. Therefore, as shown in FIG. 3, the feedback currents (Ifb) also flow through the switch-resistances Rsw 324, 325

The conversion equation (during conversion when c=0) for the ADC 316 of FIG. 3 is, on average:

$$V_{in}=(R_1+Rsw) \cdot I_{fbp} - (R_1+Rsw) \cdot I_{fbm} = (R_1+Rsw) \cdot (I_{fbp}-I_{fbm})$$

That is, the resistance of the multiplexer-switches (Rsw) has become part of the conversion equation. Therefore, in order to minimise the negative effects of the multiplexer-switches on the accuracy of the conversion equation, Rsw should have a small value versus R1 in order to be negligible in ON mode. Therefore the multiplexer-switch should be large in size. However, even if Rsw is made small in value, its variations over process, temperature and lifetime drift will cause inaccuracies. Furthermore, the multiplexer-switches should be made with high voltage transistors in order to sustain the input voltage when in OFF mode. Further still, since there is no external filter (outside the chip) to protect the input pins, voltage transients may occur that could create rectification phenomena across the multiplexer-switch. Such rectifications are strongly non-linear and will also create inaccuracies. Therefore, it has been found that there are a number of disadvantages to placing the multiplexer in front of the ADC, as shown in FIG. 3.

Figure 4:
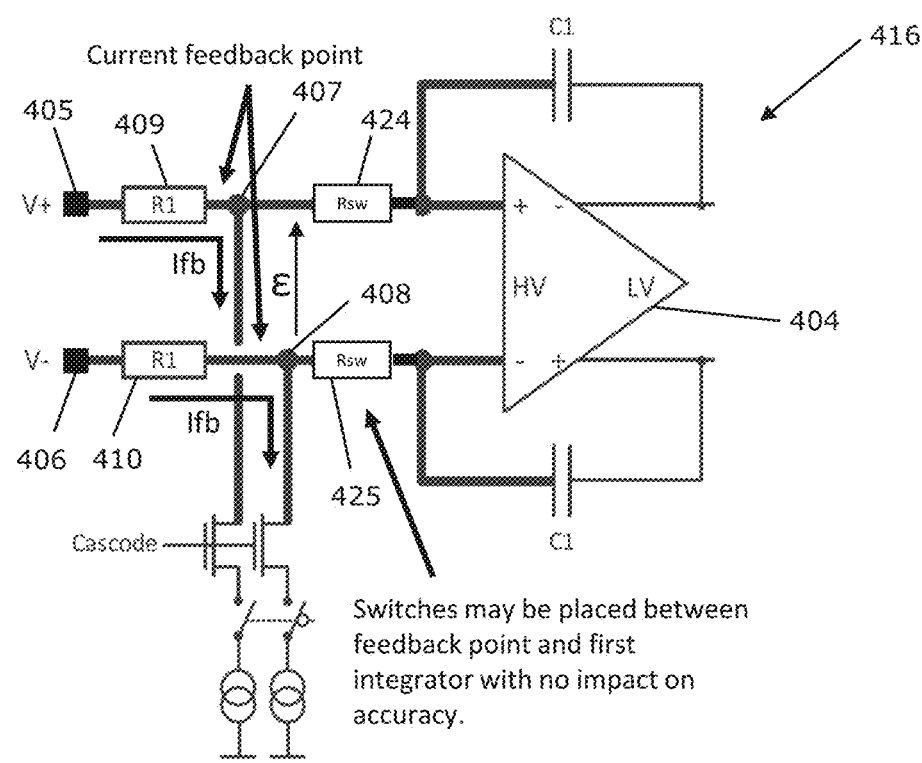
FIG. 4 illustrates a continuous-time delta-sigma ADC that includes a multiplexer according to an example embodiment of the present disclosure.

FIG. 4 illustrates a continuous-time delta-sigma ADC 416 that includes a multiplexer according to an example embodiment of the present disclosure. As will be described in detail below, the multiplexer-switches are placed in a different position when compared with the ADC of FIG. 3. Again, the functionality of the multiplexer is illustrated by switch-resistances Rsw 424, 425, which represent equivalent resistors of corresponding multiplexer-switches when they are closed. More specifically, the multiplexer-switches are placed between the respective feedback-nodes 407, 408 and the first-amplifier-stage 404.

As shown in FIG. 4, the feedback current (Ifb), which counters the effect on the input voltage across the input-resistors, R1, 409, 410 does not go through the multiplexer-switches (as represented by the switch-resistances, Rsw, 424, 425). This is in contrast to the ADC of FIG. 3. As a result, the switch-resistances, Rsw, 424, 425, which can be in the range of a few kΩ, does not have any impact on the conversion equations. Therefore, advantageously, the multiplexer-switches do not reduce the accuracy of the conversion equation. Therefore, although the multiplexer-switches can be made with high voltage (HV) components (Nmos typically), these switches can be made minimum in size.

When a multiplexer-switch is in OFF mode, the input-resistors, R1, 409, 410 protect the multiplexer-switches. The input-resistors, R1, 409, 410 can be of the order of MΩ. When a multiplexer-switch is in ON mode, the loop is closed ($\epsilon=0V$), transient voltages at the multiplexer-switch inputs are kept to a minimum, and therefore potentially problematic rectification mechanisms are avoided or reduced. That is, the multiplexer-switches can be protected by the inherent low-pass filtering nature of the continuous time Sigma Delta ADC when the multiplexer-switch is in ON mode, and by the input-resistors, R1, 409, 410 in OFF mode.

The topology of FIG. 4 can avoid the need for the multiplexer-switches to be directly placed on pads that provide the input-terminals 405, 406.

Figure 5:
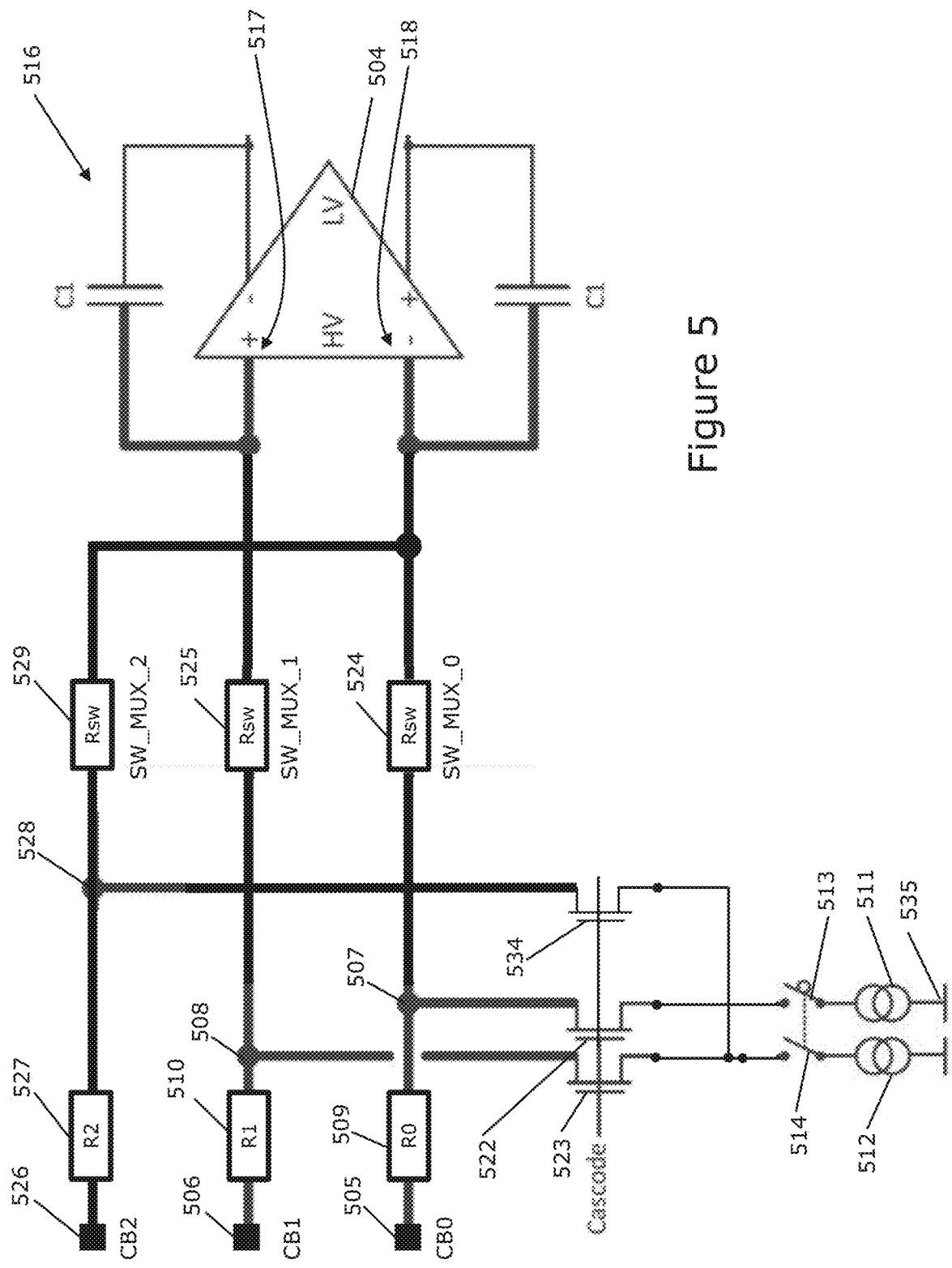
FIG. 5 shows an example embodiment of a sigma-delta ADC according to the present disclosure.

FIG. 5 shows an example embodiment of a sigma-delta ADC 516 according to the present disclosure. The ADC 516 of FIG. 5 is similar to that of FIG. 4, although it shows how a third-input-terminal 526 can also be connected to the first-amplifier-stage 504. That is, the ADC 516 of FIG. 5 has three input-terminals:
a first-input-terminal, CB0, 505 configured to receive a first-analogue-input-signal;
a second-input-terminal, CB1, 506 configured to receive a second-analogue-input-signal; and
a third-input-terminal, CB2, 526 configured to receive a third-analogue-input-signal.

It will be appreciated from the earlier discussion that: a first battery cell can be connected between the first-input-terminal, CB0, 505 and the second-input-terminal, CB1, 506; and a second battery cell can be connected between the second-input-terminal, CB1, 506 and the third-input-terminal, CB2, 526. Therefore, the analogue-input-signals that are received at the input-terminals are voltage signals at different points in a stack of battery cells. In many applications there will be additional input-terminals such that additional battery cells can be connected to the ADC 516.

The ADC 516 also has a reference-terminal 535, which, as will be discussed below, can be connected to ground or a negative voltage.

In the same way as discussed above, the ADC 516 includes a first-amplifier-stage 504. In this example, the first-amplifier-stage 504 is an operational transconductance amplifier (OTA). The first-amplifier-stage 504 comprises: a first-amplifier-first-input-terminal (which in this example is a positive input terminal); and a first-amplifier-second-input-terminal (which in this example is a negative terminal). The first-amplifier-stage 504 may be the only stage in the ADC 516 such that a first order ADC is provided. Alternatively, there may be additional, subsequent stages such that second, or higher, order ADC is provided.

The ADC 516 includes the following input-resistors:
a first-input-resistor, R0, 509 connected in series between the first-input-terminal,
CB0, 505 and a first-feedback-node 507; a second-input-resistor, R1, 510 connected in series between the second-input-terminal, CB1, 506 and a second-feedback-node 508; and a third-input-resistor, R2, 527 connected in series between the third-input-terminal,
CB2, 526 and a third-feedback-node 528.

The ADC 516 also includes the following multiplexer-switches, which are again represented by their corresponding switch-resistances Rsw:
a first-multiplexer-switch, SW_MUX_0, 524 connected in series between the first-feedback-node 507 and the first-amplifier-second-input-terminal 518;
a second-multiplexer-switch, SW_MUX_1, 525 connected in series between the second-feedback-node 508 and the first-amplifier-first-input-terminal 517; and
a third-multiplexer-switch, SW_MUX_2, 529 connected in series between the third-feedback-node 528 and the first-amplifier-second-input-terminal 518.

As will be discussed in detail below, the multiplexer-switches can be selectively opened and closed in order to connect a battery cell to the first-amplifier-stage 504 such that it's cell voltage can be measured.

In the same way as described above, the ADC 516 has two feedback-current-sources: a first-feedback-current-source 511 and a second-feedback-current-source 512. Each of the feedback-current-sources 511, 512 is for providing a feedback current to a feedback node associated with a respective one of the first-amplifier-input-terminals 517, 518. In this example, either the first-feedback-node 507 or the third-feedback-node 528 can be connected to the first-amplifier-second-input-terminal 518 (depending upon the state of the first- and third multiplexer-switches 524, 529). Therefore, as will be discussed below, additional feedback-selection-switches are provided to selectively connect the first-feedback-current-source to either the first-feedback-node 507 or the third-feedback-node 528.

Turning now to the two feedback-current-sources in more detail. The first-feedback-current-source 511 has a first terminal and second terminal, wherein the second terminal is connected to the reference-terminal 535. Similarly, the second-feedback-current-source has a first terminal and second terminal, wherein the second terminal is connected to the reference-terminal 535. FIG. 5 also shows the first-feedback-switch 513 and the second-feedback-switch 514, that are in series with a corresponding one of the respective feedback-current-sources and are described in detail with reference to FIG. 2.

The ADC 516 includes the following feedback-selection-switches, one for each of the input-terminals 505, 506, 526:
a first-feedback-selection-switch 522 connected in series between the first-feedback-node 507 and the first terminal of the first-feedback-current-source 511 (via the first-feedback-switch 513);
a second-feedback-selection-switch 523 connected in series between the second-feedback-node 508 and the first terminal of the second-feedback-current-source 512 (via the second-feedback-switch 514); and
a third-feedback-selection-switch 534 connected in series between the third-feedback-node 528 and the first terminal of the first-feedback-current-source 511 (via the first-feedback-switch 513).

In this example, the feedback-selection-switches 522, 523, 534 are implemented as cascodes.

In use, if a battery cell between the first-input-terminal, CB0, 505 and the second-input-terminal, CB1, 506 is to be measured, then the various switches in FIG. 5 are operated as follows:
the first-multiplexer-switch, SW_MUX_0, 524 is closed;
the second-multiplexer-switch, SW_MUX_1, 525 is closed;
the third-multiplexer-switch, SW_MUX_2, 529 is open;
the first-feedback-selection-switch 522 is closed;
the second-feedback-selection-switch 523 is closed; and the third-feedback-selection-switch 534 is open.

In this way, the first-input-terminal, CB0, 505 and the second-input-terminal, CB1, 506 are connected to the first-amplifier-input-terminals 517, 518. Also, the two feedback-current-sources 511, 512 are connected to the feedback-nodes 507, 508 associated with the first-input-terminal, CB0, 505 and the second-input-terminal, CB1, 506.

If a battery cell between the second-input-terminal, CB1, 506 and the third-input-terminal, CB2, 526 to be measured, then the various switches in FIG. 5 are operated as follows:
 the first-multiplexer-switch, SW_MUX_0, 524 is open;
 the second-multiplexer-switch, SW_MUX_1, 525 is closed;
 the third-multiplexer-switch, SW_MUX_2, 529 is closed;
 the first-feedback-selection-switch 522 is open;
 the second-feedback-selection-switch 523 is closed; and
 the third-feedback-selection-switch 534 is closed.

In this way, the second-input-terminal, CB1, 506 and the third-input-terminal, CB2, 526 are connected to the first-amplifier-input-terminals 517, 518. Also, the two feedback-current-sources 511, 512 are connected to the feedback-nodes 508, 528 associated with the second-input-terminal, CB1, 506 and the third-input-terminal, CB2, 526.

FIG. 6 shows another example embodiment of a high voltage multiplexed continuous time sigma-delta ADC 616 according to an embodiment of the present disclosure. In this example, the ADC is second order (i.e., it has a first stage and a second stage)

In this example, 19 input-terminals CB0-CB18 are shown such that the ADC 616 can measure the voltage across 18 battery cells connected therebetween. The multiplexer-switches, that are shown separately in FIGS. 4 and 5, are illustrated collectively in FIG. 6 as multiplexers 637, 638. Similarly, the feedback-selection-switches are also shown collectively as feedback-selection-multiplexers 639, 640 in FIG. 6.

As will be discussed below, the ADC 616 of FIG. 6 also includes chopping switches that can be operated in order to cancel any offset that is introduced by the first-amplifier-stage 604. The process of chopping involves switching the input signals to the first-amplifier-stage 604 such that both a positive and negative conversion are performed. Then, any offset that is introduced by the first-amplifier-stage 604 can be removed in subsequent processing by: subtracting one of the conversion results from the other and dividing the result by two. This is achievable because any offset error does not change sign when the input signals are reversed. The chopping switches are shown schematically in FIG. 6 as a first-chopping-block 641 and a second-chopping-block 642, and will be described in more detail below.

Advantageously, including chopper stabilization to measurement system that is associated with the ADC 616 of FIG. 6 can improve performance in terms of offset over temperature and lifetime.

As can be seen from FIG. 6, the feedback-nodes 643 are at the intersection between the input-resistors 644 and the multiplexers 637, 638. As discussed above, this can ensure that the inclusion of the multiplexers 637, 638 does not detract from the accuracy of the conversion.

Also, in this example the reference-terminal 635 is connected to a negative reference voltage (i.e. lower than ground). This can enable accurate conversions to be performed when a relatively low common voltage is presented at the first-amplifier-input-terminals of the first-amplifier-stage 604, for instance when the first battery cell in a stack is being measured. Since feedback current (Ifb) is flowing downwards (as shown in FIGS. 3 and 4), the input common mode voltage of the first-amplifier-stage 604 can be lower than the input common mode of the cell itself. Therefore, connecting the reference-terminal 635 to a negative reference voltage can ensure that the feedback current (Ifb) flows in the correct direction, even for low common mode voltage input signals. That is, use of a negative reference voltage can ensure that there is enough headroom for the feedback-current-sources 611, 612, even when measuring the first battery cell. This can represent a significant improvement in performance.

Figure 7:
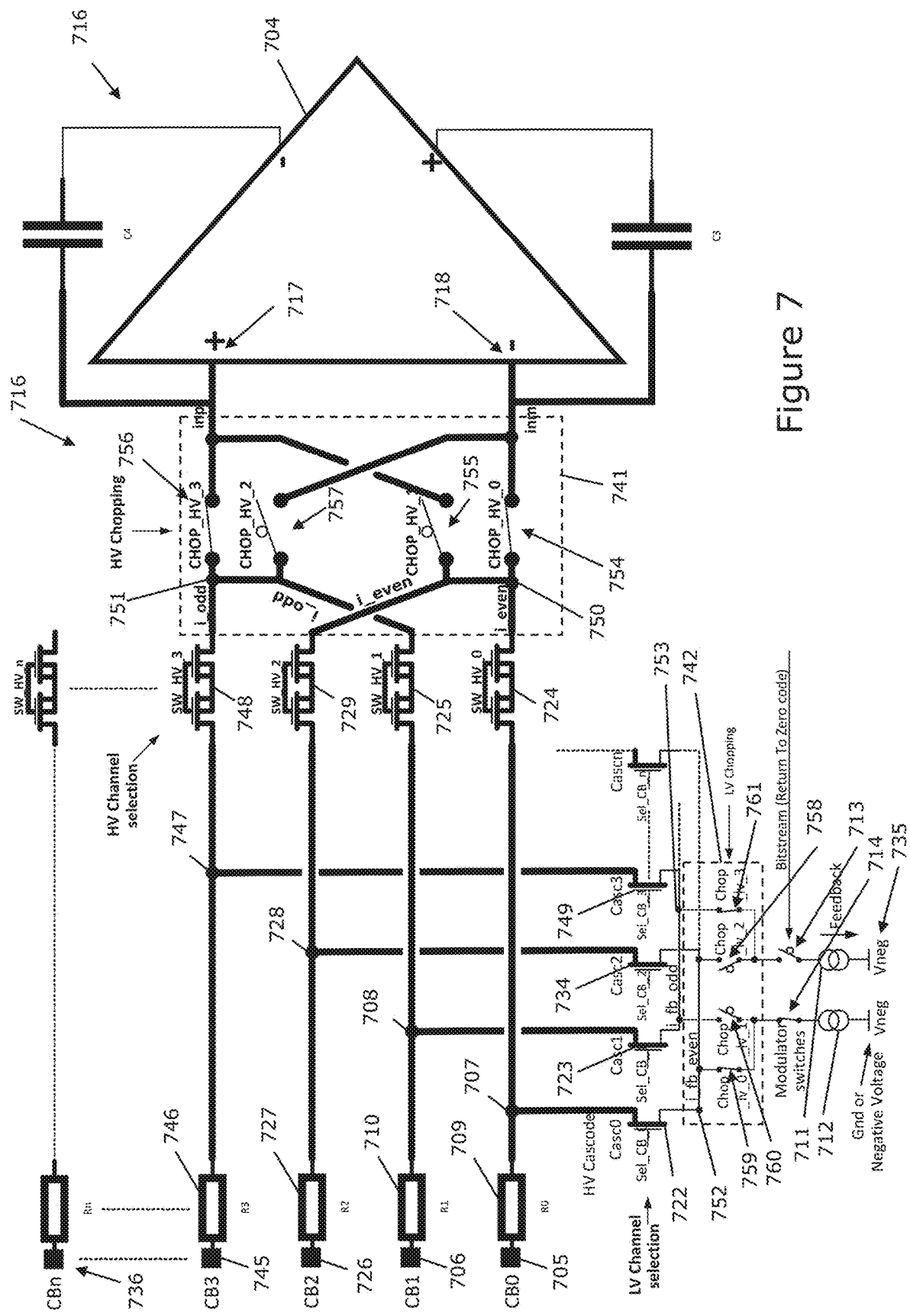
FIG. 7 illustrates an ADC according to an example embodiment of the present disclosure.

FIG. 7 illustrates an ADC 716 according to an example embodiment of the present disclosure. Operation of the ADC 716 with respect to four input-terminals (and therefore three battery cells connected therebetween) will be described, although as illustrated in FIG. 7, the ADC 716 can readily be extended to any number, n, of battery cells. It will be appreciated from the description that follows that due, to the repeating nature of the design of the ADC 716, it is convenient to describe the input-terminals 736 as either an even-input terminal (the first-input-terminal, CB0, 705; the third-input-terminal, CB2, 726; etc.) or an odd-input-terminal (the second-input-terminal, CB1, 406; the fourth-input-terminal, CB3, 745; etc.). Components that are associated with an odd-input-terminal can be given a name that is prefixed with odd-, and components that are associated with an even-input-terminal can be given a name that is prefixed with even-.

Components and features of the ADC 716 in FIG. 7 that are also shown in the ADC in FIG. 5 will be given corresponding reference numbers in the 700 series, and will not necessarily be described again here. In particular, the first-, second- and third-input terminals 705, 706, 726 and their associated components have been described in detail with respect to FIG. 5. It can be seen from FIG. 7 that the fourth-input-terminal 745 has associated components that are similar to those associated with the second-input-terminal 706 since they are both odd-input-terminals.

More generally, the ADC 716 can be considered as having the following "even" components:
 even-input-terminals (CB0 705, CB2 726, CB4, CB6, etc.) each configured to receive a respective even-analogue-input-signal;
 even-input-resistors (R0 709, R2 727, R4, R6, etc.), each connected in series between a respective one of the even-input-terminals and a respective even-feedback-node (707, 728, etc.);
 even-multiplexer-switches (SW_HV_0 724, SW_HV_2 729, SW_HV_4, SW_HV_6, etc.), each connected in series between a respective one of the even-feedback-nodes and (at least) the first-amplifier-second-input-terminal 718. (In fact, as will be discussed below in relation to the chopping functionality, in the ADC 716 of FIG. 7 the even-multiplexer-switches are connectable to either the first-amplifier-second-input-terminal 718 or the first-amplifier-first-input-terminal 717); and
 even-feedback-selection-switches (Casc0 722, Casc2 734, Casc4, Casc6 etc.), each connected in series between a respective one of the even-feedback-nodes and the first terminal of (at least) the first-feedback-current-source 711. (In fact, as will be discussed below in relation to the chopping functionality, in the ADC 716 of FIG. 7 the even-feedback-selection-switches are connectable to either the first-feedback-current-source 711 or the second-feedback-current-source 712.)

The ADC 716 can also be considered as having the following "odd" components:

odd-input-terminals (CB1 706, CB3 745, CB5, CB7, etc.) each configured to receive a respective odd-analogue-input-signal;

odd-input-resistors (R1 710, R3 746, R5, R7, etc.), each connected in series between a respective one of the odd-input-terminals and a respective odd-feedback-node (708, 747, etc.);

odd-multiplexer-switches (SW_HV_1 725, SW_HV_3 748, SW_HV_5, SW_HV_7, etc.), each connected in series between a respective one of the odd-feedback-nodes and (at least) the first-amplifier-first-input-terminal 717. (In fact, as will be discussed below in relation to the chopping functionality, in the ADC 716 of FIG. 7 the odd-multiplexer-switches are connectable to either the first-amplifier-first-input-terminal 717 or the first-amplifier-second-input-terminal 718);

odd-feedback-selection-switches (Casc1 723, Casc3 749, Casc5, Casc7 etc.), each connected in series between a respective one of the odd-feedback-nodes and the first terminal of (at least) the second-feedback-current-source 712. (In fact, as will be discussed below in relation to the chopping functionality, in the ADC 716 of FIG. 7 the odd-feedback-selection-switches are connectable to either the second-feedback-current-source 712 or the first-feedback-current-source 711.)

Turning now to the chopping functionality, the first-chopping-block 741 can beneficially be implemented with only four switches, irrespective of the number of input-terminals: a first-even-amplifier-connection-switch 754; a second-even-amplifier-connection-switch 755; a first-odd-amplifier-connection-switch 756; and a second-odd-amplifier-connection-switch 757.

The first-multiplexer-switch, SW_HV_0, 724 is connected in series between the first-feedback-node 707 and an even-amplifier-connection-node 750. The third-multiplexer-switch, SW_HV_2, 729 is connected in series between the third-feedback-node and the even-amplifier-connection-node 750. In this way, the first-, third- and any further even-multiplexer-switches are connected to the even-amplifier-connection-node 750.

The first-even-amplifier-connection-switch 754 is connected in series between the even-amplifier-connection-node 750 and the first-amplifier-second-input-terminal 718. The second-even-amplifier-connection-switch 755 is connected in series between the even-amplifier-connection-node 750 and the first-amplifier-first-input-terminal 717. In this way, the first-even-amplifier-connection-switch 754 and the second-even-amplifier-connection-switch 755 can be used to selectively connect the even-amplifier-connection-node 750 to either: the first-amplifier-second-input-terminal 718 or the first-amplifier-first-input-terminal 717.

The second-multiplexer-switch, SW_HV_1 725 is connected in series between the second-feedback-node 708 and an odd-amplifier-connection-node 751. The fourth-multiplexer-switch, SW_HV_3, 748 is connected in series between the fourth-feedback-node 747 and the odd-amplifier-connection-node 751. In this way, the second-, fourth- and any further odd-multiplexer-switches are connected to the odd-amplifier-connection-node 751.

The first-odd-amplifier-connection-switch 756 is connected in series between the odd-amplifier-connection-node 751 and the first-amplifier-first-input-terminal 717. The second-odd-amplifier-connection-switch 757 is connected in series between the odd-amplifier-connection-node 751 and the first-amplifier-second-input-terminal 718. In this way, the first-odd-amplifier-connection-switch 756 and the second-odd-amplifier-connection-switch 757 can be used to selectively connect the odd-amplifier-connection-node 751 to either: the first-amplifier-second-input-terminal 718 or the first-amplifier-first-input-terminal 717.

Each of the amplifier-connection-switches 754, 755, 756, 757 is controlled by the same HV-chopping-control-signal such that the first-even-amplifier-connection-switch 754 and the first-odd-amplifier-connection-switch 756 are always in the same state, and such that the second-even-amplifier-connection-switch 755 and the second-odd-amplifier-connection-switch 757 are always in the opposite state to the first-even-amplifier-connection-switch 754 and the first-odd-amplifier-connection-switch 756. That is, either:

the first-even-amplifier-connection-switch 754 is ON, the first-odd-amplifier-connection-switch 756 is ON, the second-even-amplifier-connection-switch 755 is OFF and the second-odd-amplifier-connection-switch 757 is OFF; or the first-even-amplifier-connection-switch 754 is OFF, the first-odd-amplifier-connection-switch 756 is OFF, the second-even-amplifier-connection-switch 755 is ON and the second-odd-amplifier-connection-switch 757 is ON.

In this way, the even-amplifier-connection-node 750 is connected to only one of: the first-amplifier-first-input-terminal 717 or the first-amplifier-second-input-terminal 718. Similarly, the odd-amplifier-connection-node 751 is only connected to the other one of: the first-amplifier-first-input-terminal 717 and the first-amplifier-second-input-terminal 718.

Turning now to the second-chopping-block 742. The second-chopping-block 742 can also beneficially be implemented with only four switches, irrespective of the number of input-terminals: a first-even-current-source-connection-switch 758; a second-even-current-source-connection-switch 759; a first-odd-current-source-connection-switch 760; and a second-odd-current-source-connection-switch 761. The HV cascode transistor is also a selection switch since it allows the feedback current of the modulator to be applied to the corresponding CB pin.

The first-feedback-selection-switch, Casc0, 722 is connected in series between the first-feedback-node 707 and an even-current-source-connection-node 752. The third-feedback-selection-switch, Casc2, 734 is connected in series between the third-feedback-node 728 and the even-current-source-connection-node 752. In this way, the first-, third- and any further even-feedback-selection-switches are connected to the even-current-source-connection-node 752.

The first-even-current-source-connection-switch 758 is connected in series between the even-current-source-connection-node 752 and the first-feedback-current-source 711. The second-even-current-source-connection-switch 759 is connected in series between the even-current-source-connection-node 752 and the second-feedback-current-source 712. In this way, the first-even-current-source-connection-switch 758 and the second-even-current-source-connection-switch 759 can be used to selectively connect the even-current-source-connection-node 752 to either: the first-feedback-current-source 711 or the second-feedback-current-source 712.

The second-feedback-selection-switch, Casc1, 723 is connected in series between the second-feedback-node 708 and an odd-current-source-connection-node 753. The fourth-feedback-selection-switch, Casc3, 749 is connected in series between the fourth-feedback-node 747 and the odd-current-source-connection-node 753. In this way, the second-, fourth- and any further odd-feedback-selection-switches are connected to the odd-current-source-connection-node 753.

The first-odd-current-source-connection-switch 760 is connected in series between the odd-current-source-connection-node 753 and the second-feedback-current-source 712.

The second-odd-current-source-connection-switch 761 is connected in series between the odd-current-source-connection-node 753 and the first-feedback-current-source 711. In this way, the first-odd-current-source-connection-switch 760 and the second-odd-current-source-connection-switch 761 can be used to selectively connect the odd-current-source-connection-node 753 to either: the first-feedback-current-source 711 or the second-feedback-current-source 712.

Each of the current-source-connection-switches 758, 759, 760, 761 is controlled by the same LV-chopping-control-signal such that the first-even-current-source-connection-switch 758 and the first-odd-current-source-connection-switch 760 are always in the same state, and such that the second-even-current-source-connection-switch 759 and the second-odd-current-source-connection-switch 761 are always in the opposite state to the first-even-current-source-connection-switch 758 and the first-odd-current-source-connection-switch 760. That is, either:

the first-even-current-source-connection-switch 758 is ON, the first-odd-current-source-connection-switch 760 is ON, the second-even-current-source-connection-switch 759 is OFF and the second-odd-current-source-connection-switch 761 is OFF; or the first-even-current-source-connection-switch 758 is OFF, the first-odd-current-source-connection-switch 760 is OFF, the second-even-current-source-connection-switch 759 is ON and the second-odd-current-source-connection-switch 761 is ON.

In this way, the even-current-source-connection-node 752 is connected to only one of: the first-feedback-current-source 711 or the second-feedback-current-source 712. Similarly, the odd-current-source-connection-node 753 is only connected to the other one of: the first-feedback-current-source 711 and the second-feedback-current-source 712.

Furthermore, the HV-chopping-control-signal and the LV-chopping-control-signal are configured to control the amplifier-connection-switches 754, 755, 756, 757 and the current-source-connection-switches 758, 759, 760, 761 respectively such that the correct feedback-current-sources 711, 712 are connectable to the correct current-source-connection-nodes 752, 753, based on the connections between the amplifier-connection-nodes 750, 751 and the first-amplifier-input-terminals 717, 718.

By way of generalisation of some of the above description:

each of the even-multiplexer-switches (SW_HV_0 724, SW_HV_2 729, SW_HV_4, SW_HV_6, etc.) is connected in series between the respective one of the even-feedback-nodes (707, 728, etc.) and the even-amplifier-connection-node 750;

each of the odd-multiplexer-switches (SW_HV_1 725, SW_HV_3 748, SW_HV_5, SW_HV_7, etc.) is connected in series between the respective one of the odd-feedback-nodes (708, 747) and the odd-amplifier-connection-node 751;

each of the even-feedback-selection-switches (Casc0 722, Casc2 734, Casc4, Casc6, etc.) is connected in series between the respective one of the even-feedback-nodes (707, 728, etc.) and the even-current-source-connection-node 752; and each of the odd-feedback-selection-switches (Casc1 723, Casc3 749, Casc5, Casc7, etc.) is connected in series between the respective one of the odd-feedback-nodes (708, 747) and the odd-current-source-connection-node 753.

FIG. 7 also shows the first-feedback-switch 713 and the second-feedback-switch 714, the functionality and purpose of which are described above.

In this example, the first-feedback-switch 713 is connected in series between: i) the first-feedback-current-source 711; and ii) each of the first-even-current-source-connection-switch 758 and the second-odd-current-source-connection-switch 761. The first-feedback-switch 713 is configured to selectively disconnect the first-feedback-current-source 711 from the even-current-source-connection-node 752 and the odd-current-source-connection-node 753 (and therefore all of the upstream components of the ADC 716) based on the output bitstream of the ADC 716.

The second-feedback-switch 714 is connected in series between: i) the second-feedback-current-source 712; and ii) each of the second-even-current-source-connection-switch 759 and the first-odd-current-source-connection-switch 760. The second-feedback-switch 714 is configured to selectively disconnect the second-feedback-current-source 712 from the even-current-source-connection-node 752 and the odd-current-source-connection-node 753 (and therefore all of the upstream components of the ADC 716) based on the output bitstream of the ADC 716.

We will now step through operation of the ADC 716 of FIG. 7, as it is used to measure the voltage across three battery cells that are connected between the four input-terminals, CB0-CB3. As indicated above, the first-chopper-block 741 (that can be referred to as an HV chopper circuit) aims at swapping both inputs of the first-amplifier-stage 704. As a consequence, the input signal coming from the measured cell will be applied to the inputs of the first-amplifier-stage 704 with the opposite polarity. If a first conversion of a given cell gave a positive result, then after swapping the chopper switches in the first-chopper-block 741, the next result will be negative. However both positive and negative conversion results will be affected by the same offset error. Therefore, as indicated above, by subtracting both results and dividing by 2, the error coming from the input referred offset of the converter can be reduced or eliminated. However, for the circuit of FIG. 7, in order to maintain stability of the whole modulator, the second-chopping-block 742 performs LV chopping. The reason is that the feedback current aims at maintaining the output of the first-amplifier-stage 704 within stable boundaries through negative feedback. Swapping the signals to the first-amplifier-first-input-terminal 717 and the first-amplifier-second-input-terminal 718 without swapping the feedback current polarity would automatically make this feedback positive and therefore cause the modulator to rail-out.

Therefore, we see that in the architecture of FIG. 7, the second-chopping-block 742 improves the stability of the modulator, while the first-chopping-block 741 applies the same input voltages to the first-amplifier-stage 704 with an opposite polarity, so that proper offset cancellation can be undertaken.

Turning now to measurement of the first battery cell, which is connected between the first-input-terminal, CB0, 705 and the second-input-terminal, CB1, 706, the following switches are selected:

the first-feedback-selection-switch, Casc0, 722; which is controlled by a Sel_CB_0 signal;

the second-feedback-selection-switch, Casc1, 723; which is controlled by a Sel_CB_1 signal;

the first-multiplexer-switch, SW_HV_0, 724; which is controlled by a Sel_CB_0 signal, transferred to an appropriate voltage level to drive this switch;

the second-multiplexer-switch, SW_HV_1, 725; which is controlled by a Sel_CB_1 signal, transferred to an appropriate voltage level to drive this switch.

A first conversion is made (positive), and then chopping is applied and a second conversion is taken (negative this time). As discussed above, the offset can be cancelled by appropriately processing both results.

We will now turn to measurement of the second battery cell, which is connected between the second-input-terminal, CB1, 706 and the third-input-terminal, CB2, 726. When the second battery cell is converted, since the second-input-terminal, CB1, is common to the previous cell, only the first-input terminal, CB0, 705 needs to be disconnected, and the third-input-terminal, CB2, 726 connected instead. Therefore, the following changes in switch selection are performed in order to transition from measurement of the first battery cell to measurement of the second battery cell:

the first-feedback-selection-switch, Casc0, 722 is turned OFF by the Sel_CB_0 signal;

the third-feedback-selection-switch, Casc2, 734 is turned ON by the Sel_CB_2 signal;

the first-multiplexer-switch, SW_HV_0 724 is turned OFF by the Sel_CB_0 signal, transferred to an appropriate voltage level to drive this switch; and the third-multiplexer-switch, SW_HV_2, 729 is turned ON by the Sel_CB_2 signal, transferred to an appropriate voltage level to drive this switch.

It is therefore apparent that the new cell is applied to the input of the first-amplifier-stage 704 with an opposite polarity versus the previous cell. As a consequence, if the previous cell's conversion was negative, this new cell's conversion will be positive without changing the state of the first-chopping-block 741. The chopping state is then swapped after this first conversion to collect the negative conversion result such that the offset compensated result can be computed.

We will not turn to measurement of the third battery cell, which is connected between the third-input-terminal, CB2, 726 and the fourth-input-terminal, CB3, 745. Again, the third-input-terminal, CB2, 726 is common to the previous cell, and therefore only the second-input-terminal, CB1, 706 needs to be disconnected, with the fourth-input-terminal, CB3, 745 connected instead. Therefore, the following changes in switch selection are performed in order to transition from measurement of the second battery cell to measurement of the third battery cell:

the second-feedback-selection-switch, Casc1, 723 is turned OFF by the Sel_CB_1 signal;

the fourth-feedback-selection-switch, Casc3, 749 is turned ON by the Sel_CB_3 signal;

the second-multiplexer-switch, SW_HV_1, 725 is turned OFF by the Sel_CB_1 signal, transferred to an appropriate voltage level to drive this switch; and the fourth-multiplexer-switch, SW_HV_3, 748 is turned ON by the Sel_CB_3 signal, transferred to an appropriate voltage level to drive this switch.

It is therefore apparent that the new cell is applied to the input of the converter with an opposite polarity versus the previous cell. As a consequence if the previous cell's conversion was negative, this new cell's conversion will be positive without changing the state of the first-chopping-block 741. The chopping state is then swapped after this first conversion to collect the negative conversion result such that the offset compensated result can be computed.

It will be appreciated that the same sequence can be repeated and continued to convert as many channels as the device is designed to accommodate. For example, in one application, the ADC 716 can convert up to 18 battery cells.

Another way of performing the HV chopping function (in the first-chopping-block 741) would have been to allow each input-terminal (that is, each CB pin) to be connected to either input of the first-amplifier-stage 704. However this would cause the number of HV selection switches (that is, the number of multiplexer-switches) to double. Therefore, use of the first-chopping-block 741 as it is implemented in FIG. 7 can result in a significant die area saving.

Figure 8:
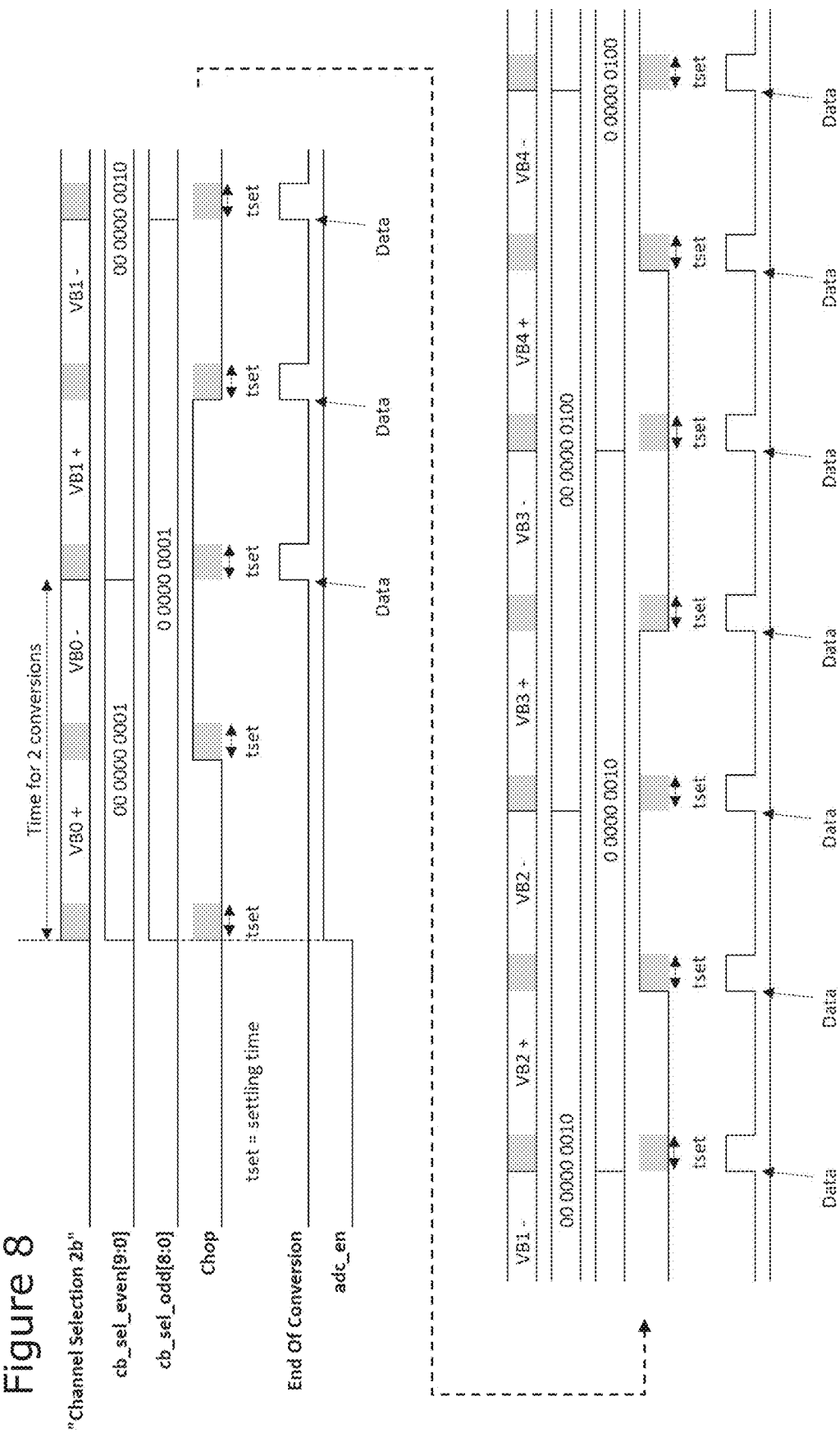
FIG. 8 shows a timing diagram to illustrate the operation of the ADC of FIG. 7.

FIG. 8 shows a timing diagram to illustrate the operation of the ADC 716 of FIG. 7 as it is described above.

Delta-sigma modulators can need some settling time before bitstream data can be taken into account in the digital filter. Two ways to do this include:

1. resetting the integrator capacitors and immediately integrating the bitstream data;
   but this would require some high voltage switches across the integrator capacitors;
   although the conversion will be quicker than that of the second option; and
2. waiting a few clock cycles to flush the previous state of the integrator, and reach a new steady state based on the new input value.
   This is the option that is illustrated in FIG. 8 here, to avoid the need for additional high voltage switches.

However, it will be appreciated that examples disclosed herein can also be implemented as per the first option.

Examples disclosed herein relate to a high-voltage multiplexed continuous time delta-sigma converter that is immune to the ON resistance of the multiplexer switches. This can be achieved by the way the feedback in current is applied at the intersection of the resistors and the selection switches, as explained above. The use of a HV chopper after the selection switches enables the use of a low number of HV switches (one per CB pin), which is beneficial as such HV switches are quite big.

Such high voltage multiplexed continuous time delta-sigma converters can accurately measure a set of battery cell elements stacked together over a very large common mode voltage range. The way the multiplexing part of the converter is organized makes it more robust to external EMC than discrete time converters that need an external anti-aliasing filter, and also immune to the ON resistance of the switches, without any loss of accuracy. This property enables the addition of some chopping switches in series with the multiplexer in order to cancel the offset coming from the first integrator high voltage operational amplifier (OA). In Battery Management Systems (BMS) applications, having an architecture that is immune to the series resistance of the multiplexer, and having a chopper that is stabilized, enables excellent performance over the lifetime of the measurement channels.

It will be appreciated that any components that are described or illustrated herein as being coupled or connected could be directly or indirectly coupled or galvanically connected. That is, one or more components could be located between two components that are said to be coupled or connected whilst still enabling the required functionality to be achieved.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A sigma-delta ADC comprising:
a first-input-terminal configured to receive a first-analogue-input-signal;
a second-input-terminal configured to receive a second-analogue-input-signal;
a third-input-terminal configured to receive a third-analogue-input-signal;
a reference-terminal;
a first-amplifier-stage comprising:
a first-amplifier-first-input-terminal;
a first-amplifier-second-input-terminal;
a first-input-resistor connected in series between the first-input-terminal and a first-feedback-node;
a second-input-resistor connected in series between the second-input-terminal and a second-feedback-node;
a third-input-resistor connected in series between the third-input-terminal and a third-feedback-node;
a first-multiplexer-switch connected in series between the first-feedback-node and the first-amplifier-second-input-terminal;
a second-multiplexer-switch connected in series between the second-feedback-node and the first-amplifier-first-input-terminal;
a third-multiplexer-switch connected in series between the third-feedback-node and the first-amplifier-second-input-terminal;
a first-feedback-current-source having a first terminal and second terminal, wherein the second terminal is connected to the reference-terminal;
a second-feedback-current-source having a first terminal and second terminal, wherein the second terminal is connected to the reference-terminal;
a first-feedback-selection-switch connected in series between the first-feedback-node and the first terminal of the first-feedback-current-source;
a second-feedback-selection-switch connected in series between the second-feedback-node and the first terminal of the second-feedback-current-source; and
a third-feedback-selection-switch connected in series between the third-feedback-node and the first terminal of the first-feedback-current-source.

2. The sigma-delta ADC of claim 1, further including one or more:
even-input-terminals each configured to receive a respective even-analogue-input-signal;
even-input-resistors, each connected in series between a respective one of the even-input-terminals and a respective even-feedback-node;
even-multiplexer-switches, each connected in series between a respective one of the even-feedback-nodes and the first-amplifier-second-input-terminal; and
even-feedback-selection-switches, each connected in series between a respective one of the even-feedback-nodes and the first terminal of the first-feedback-current-source.

3. The sigma-delta ADC of claim 2, further including one or more:
odd-input-terminals each configured to receive a respective odd-analogue-input-signal;
odd-input-resistors, each connected in series between a respective one of the odd-input-terminals and a respective odd-feedback-node;
odd-multiplexer-switches, each connected in series between a respective one of the odd-feedback-nodes and the first-amplifier-first-input-terminal; and
odd-feedback-selection-switches, each connected in series between a respective one of the odd-feedback-nodes and the first terminal of the second-feedback-current-source.

4. The sigma-delta ADC of claim 1, further including one or more:
odd-input-terminals each configured to receive a respective odd-analogue-input-signal;
odd-input-resistors, each connected in series between a respective one of the odd-input-terminals and a respective odd-feedback-node;

odd-multiplexer-switches, each connected in series between a respective one of the odd-feedback-nodes and the first-amplifier-first-input-terminal; and odd-feedback-selection-switches, each connected in series between a respective one of the odd-feedback-nodes and the first terminal of the second-feedback-current-source.

5. The sigma-delta ADC of claim 1, wherein:

the first-multiplexer-switch is connected in series between the first-feedback-node and an even-amplifier-connection-node;

the second-multiplexer-switch is connected in series between the second-feedback-node and an odd-amplifier-connection-node;

a third-multiplexer-switch connected in series between the third-feedback-node and the even-amplifier-connection-node;

the sigma-delta ADC further comprising:

a first-even-amplifier-connection-switch connected in series between the even-amplifier-connection-node and the first-amplifier-second-input-terminal;

a second-even-amplifier-connection-switch connected in series between the even-amplifier-connection-node and the first-amplifier-first-input-terminal;

a first-odd-amplifier-connection-switch connected in series between the odd-amplifier-connection-node and the first-amplifier-first-input-terminal; and a second-odd-amplifier-connection-switch connected in series between the odd-amplifier-connection-node and the first-amplifier-second-input-terminal.

6. The sigma-delta ADC of claim 5, wherein:

the first-feedback-selection-switch is connected in series between the first-feedback-node and an even-current-source-connection-node;

the second-feedback-selection-switch is connected in series between the second-feedback-node and an odd-current-source-connection-node;

a third-feedback-selection-switch connected in series between the third-feedback-node and the even-current-source-connection-node;

the sigma-delta ADC further comprising:

a first-even-current-source-connection-switch connected in series between the even-current-source-connection-node and the first-feedback-current-source;

a second-even-current-source-connection-switch connected in series between the even-current-source-connection-node and the second-feedback-current-source;

a first-odd-current-source-connection-switch connected in series between the odd-current-source-connection-node and the second-feedback-current-source; and a second-odd-current-source-connection-switch connected in series between the odd-current-source-connection-node and the first-feedback-current-source.

7. The sigma-delta ADC of claim 6, further comprising:

a first-feedback-switch connected in series between: i) the first-feedback-current-source; and ii) each of the first-even-current-source-connection-switch and the second-odd-current-source-connection-switch, such that the first-feedback-switch can selectively disconnect the first-feedback-current-source from the even-current-source-connection-node and the odd-current-source-connection-node; and a second-feedback-switch connected in series between: i) the second-feedback-current-source; and ii) each of the second-even-current-source-connection-switch and the first-odd-current-source-connection-switch, such that the second-feedback-switch can selectively disconnect the second-feedback-current-source from the even-current-source-connection-node and the odd-current-source-connection-node.

8. The sigma-delta ADC of claim 5, further including one or more:

even-input-terminals each configured to receive a respective even-analogue-input-signal;

even-input-resistors, each connected in series between a respective one of the even-input-terminals and a respective even-feedback-node;

even-multiplexer-switches, each connected in series between a respective one of the even-feedback-nodes and the first-amplifier-second-input-terminal; and even-feedback-selection-switches, each connected in series between a respective one of the even-feedback-nodes and the first terminal of the first-feedback-current-source.

9. The sigma-delta ADC of claim 5, further including one or more:

odd-input-terminals each configured to receive a respective odd-analogue-input-signal;

odd-input-resistors, each connected in series between a respective one of the odd-input-terminals and a respective odd-feedback-node;

odd-multiplexer-switches, each connected in series between a respective one of the odd-feedback-nodes and the first-amplifier-first-input-terminal; and odd-feedback-selection-switches, each connected in series between a respective one of the odd-feedback-nodes and the first terminal of the second-feedback-current-source.

10. The sigma-delta ADC of claim 5, wherein the reference-terminal is connected to a negative reference voltage.

11. The sigma-delta ADC of claim 5, wherein the sigma-delta ADC is a continuous time sigma-delta ADC.

12. A battery management system for a vehicle, wherein the battery management system comprises the sigma-delta ADC of claim 5.

13. The sigma-delta ADC of claim 1:

further including one or more:

even-input-terminals each configured to receive a respective even-analogue-input-signal;

even-input-resistors, each connected in series between a respective one of the even-input-terminals and a respective even-feedback-node;

even-multiplexer-switches, each connected in series between a respective one of the even-feedback-nodes and the first-amplifier-second-input-terminal; and even-feedback-selection-switches, each connected in series between a respective one of the even-feedback-nodes and the first terminal of the first-feedback-current-source;

odd-input-terminals each configured to receive a respective odd-analogue-input-signal;

odd-input-resistors, each connected in series between a respective one of the odd-input-terminals and a respective odd-feedback-node;

odd-multiplexer-switches, each connected in series between a respective one of the odd-feedback-nodes and the first-amplifier-first-input-terminal; and odd-feedback-selection-switches, each connected in series between a respective one of the odd-feedback-nodes and the first terminal of the second-feedback-current-source;

wherein:
the first-multiplexer-switch is connected in series between the first-feedback-node and an even-amplifier-connection-node;
the second-multiplexer-switch is connected in series between the second-feedback-node and an odd-amplifier-connection-node;
a third-multiplexer-switch connected in series between the third-feedback-node and the even-amplifier-connection-node;
the sigma-delta ADC further comprising:
a first-even-amplifier-connection-switch connected in series between the even-amplifier-connection-node and the first-amplifier-second-input-terminal;
a second-even-amplifier-connection-switch connected in series between the even-amplifier-connection-node and the first-amplifier-first-input-terminal;
a first-odd-amplifier-connection-switch connected in series between the odd-amplifier-connection-node and the first-amplifier-first-input-terminal;
a second-odd-amplifier-connection-switch connected in series between the odd-amplifier-connection-node and the first-amplifier-second-input-terminal;
the first-feedback-selection-switch is connected in series between the first-feedback-node and an even-current-source-connection-node;
the second-feedback-selection-switch is connected in series between the second-feedback-node and an odd-current-source-connection-node;
a third-feedback-selection-switch connected in series between the third-feedback-node and the even-current-source-connection-node;
the sigma-delta ADC further comprising:
a first-even-current-source-connection-switch connected in series between the even-current-source-connection-node and the first-feedback-current-source;
a second-even-current-source-connection-switch connected in series between the even-current-source-connection-node and the second-feedback-current-source;
a first-odd-current-source-connection-switch connected in series between the odd-current-source-connection-node and the second-feedback-current-source;
a second-odd-current-source-connection-switch connected in series between the odd-current-source-connection-node and the first-feedback-current-source;
each of the even-multiplexer-switches is connected in series between the respective one of the even-feedback-nodes and the even-amplifier-connection-node;
each of the odd-multiplexer-switches is connected in series between the respective one of the odd-feedback-nodes and the odd-amplifier-connection-node;
each of the even-feedback-selection-switches is connected in series between the respective one of the even-feedback-nodes and the even-current-source-connection-node; and
each of the odd-feedback-selection-switches is connected in series between the respective one of the odd-feedback-nodes and the odd-current-source-connection-node.

14. The sigma-delta ADC of claim 1, wherein the reference-terminal is connected to a negative reference voltage.

15. The sigma-delta ADC of claim 1, wherein the sigma-delta ADC is a continuous time sigma-delta ADC.

16. A battery management system for a vehicle, wherein the battery management system comprises the sigma-delta ADC of claim 1.

17. A vehicle comprising the battery management system of claim 16.

* * * * *